(12) United States Patent
Ono et al.

(10) Patent No.: US 8,486,837 B2
(45) Date of Patent: *Jul. 16, 2013

(54) POLISHING SLURRY FOR METAL, AND POLISHING METHOD

(75) Inventors: Hiroshi Ono, Hitachi (JP); Katsuyuki Masuda, Chikusei (JP); Masanobu Habiro, Hitachi (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 978 days.

This patent is subject to a terminal disclaimer.

(21) Appl. No.: 12/318,376

(22) Filed: Dec. 29, 2008

(65) Prior Publication Data

US 2009/0117829 A1 May 7, 2009

Related U.S. Application Data

(62) Division of application No. 10/560,228, filed as application No. PCT/JP03/07554 on Jun. 13, 2003, now abandoned.

(51) Int. Cl.
*H01L 21/00* (2006.01)
*H01L 21/02019* (2006.01)
*H01L 21/02247* (2006.01)
*H01L 21/30* (2006.01)
*C11D 11/0047* (2006.01)
*C11D 3/3945* (2006.01)

(52) U.S. Cl.
USPC ............ 438/691; 438/690; 510/175; 510/375

(58) Field of Classification Search
USPC ......... 51/307–309; 106/3; 510/175, 367–370, 510/375, 380; 438/690–694
See application file for complete search history.

(56) References Cited

U.S. PATENT DOCUMENTS

| | | | |
|---|---|---|---|
| 4,944,836 A | 7/1990 | Beyer et al. | |
| 5,700,389 A | 12/1997 | Nakagawa | |
| 5,897,375 A | 4/1999 | Watts et al. | |
| 6,217,416 B1 | 4/2001 | Kaufman et al. | |
| 6,447,371 B2 | 9/2002 | Kaufman et al. | |
| 6,585,568 B2 | 7/2003 | Tsuchiya et al. | |
| 6,666,987 B1 | 12/2003 | Morikawa et al. | |
| 6,679,929 B2 | 1/2004 | Asano et al. | |
| 6,902,626 B2 | 6/2005 | Morikawa et al. | |
| 2001/0041507 A1 | 11/2001 | Kaufman et al. | |
| 2002/0017630 A1 | 2/2002 | Uchida et al. | |
| 2002/0139055 A1 | 10/2002 | Asano et al. | |
| 2003/0000846 A1 | 1/2003 | Rzeznik et al. | |
| 2003/0203624 A1 | 10/2003 | Sameshima et al. | |
| 2005/0173669 A1 | 8/2005 | Kurata et al. | |
| 2005/0181609 A1 | 8/2005 | Kurata et al. | |
| 2006/0143990 A1 | 7/2006 | Ono et al. | |
| 2009/0117829 A1 | 5/2009 | Ono et al. | |

FOREIGN PATENT DOCUMENTS

| | | |
|---|---|---|
| CN | 1223308 A | 7/1999 |
| CN | 1312843 A | 9/2001 |
| CN | 1369530 A | 9/2002 |
| DE | 199 26 117 A1 | 12/1999 |
| EP | 0 696 651 A1 | 2/1996 |
| EP | 1 260 607 A2 | 11/2002 |
| JP | 02-278822 A | 11/1990 |
| JP | 08-083780 A | 3/1996 |
| JP | 8060386 A | 3/1996 |
| JP | 11-172467 A | 6/1999 |
| JP | 11-204942 A | 7/1999 |
| JP | 2000064067 A | 2/2000 |
| JP | 2002-134442 A | 5/2002 |
| JP | 2002164310 A | 6/2002 |
| JP | 2003034875 A | 2/2003 |
| JP | 2003183628 A | 7/2003 |
| WO | WO 00/13217 A1 | 3/2000 |

OTHER PUBLICATIONS

Chinese Office Action dated Oct. 13, 2006, issued in corresponding Chinese Patent Application No. 038266229.
F. B. Kaufman et al.; "Chemical-Mechanical Polishing for Fabricating Patterned W Metal Features as Chip Interconnects;" Journal of the Electrochem. Society, vol. 138, No. 11, Nov. 1991, pp. 3460-3465.
Japanese Office Action dated Jun. 23, 2009 (dispatch date), issued in corresponding Japanese Patent Application No. 2005-500761.

*Primary Examiner* — Pegah Parvini
(74) *Attorney, Agent, or Firm* — Westerman, Hattori, Daniels & Adrian, LLP

(57) ABSTRACT

A polishing slurry for metal comprises an oxidizer, a metal oxide dissolving agent, a metal inhibitor, and water, wherein the metal inhibitor is at least one of a compound having an amino-triazole skeleton and a compound having an imidazole skeleton. The use of the polishing slurry for metal makes it possible to raise the polishing speed sufficiently while keeping the etching speed low, restrain the generation of corrosion of the surface of a metal and dishing, and form a metal-film-buried pattern having a high reliability in the process of formation of wiring of semiconductor devices.

18 Claims, No Drawings

POLISHING SLURRY FOR METAL, AND POLISHING METHOD

This application is a divisional of U.S. application Ser. No. 10/560,228, filed on Dec. 12, 2005, which is a National Stage of International Application No. PCT/JP2003/007554, filed on Jun. 13, 2003.

TECHNICAL FIELD

The present invention relates to a polishing slurry for metal which is suitable for the process of forming wiring of a semiconductor device, and a polishing method using the same.

BACKGROUND ART

In recent years, novel microscopic working techniques have been developed with a rise in the integration degree and the performance of semiconductor integrated circuits (large scale integration: LSIs). One of them is chemical mechanical polishing (CMP), and is a technique which is frequently used in the process of producing LSIs, in particular, in the flattening of an interlayer insulating film, the formation of metal plugs, and the formation of buried wiring in the step of forming multi-layered wiring. This technique is disclosed in, for example, the specification of U.S. Pat. No. 4,944,836.

In recent years, the use of copper alloy as wiring material has been attempted in order to make the performances of LSIs high. However, it is difficult to subject copper alloy to microscopic working based on dry etching, which has been frequently used to form conventional aluminum alloy wiring. Thus, there is adopted what is called the damascene process, which is a process of depositing a copper alloy thin film onto an insulating film in which trenches are beforehand made, so as to bury the film in the trenches, and then removing the copper alloy thin film in any area other than the trenches by CMP to form buried wiring. This technique is disclosed in, for example, Japanese Patent Application Laid-Open No. 2-278822.

An ordinal method for the CMP of a metal comprises: sticking a polishing pad onto a circular polishing table (a platen); moistening the surface of the polishing pad with a polishing slurry for metal; pressing a substrate face on which a metal film is formed against the pad; and rotating the polishing table while applying a given pressure (a polishing pressure or a polishing load) thereto from the rear face of the substrate, so as to remove the metal film at convex portions by mechanical friction between the polishing slurry and the convex portions of the metal film.

The polishing slurry for metal which is used for CMP is generally composed of an oxidizer and a solid abrasive. If necessary, a metal oxide dissolving agent and a metal inhibitor are further added thereto. It appears that a basic mechanism thereof. Is to oxidize the metal film surface firstly, and polish out the oxidized layer with the solid abrasive. The oxidized layer on the metal surface at concave portions does not contact the polishing pad much, so that the polishing-out effect of the solid abrasive is not produced thereon. Accordingly, as the CMP advances, the metal layer at convex portions is removed so that the surface of the substrate is made flat. Details thereof are disclosed in Journal of Electrochemical Society, vol. 138, No. 11 (1991), pp. 3460-3464.

It is said that in order to heighten the polishing speed based on CMP, it is effective to add a metal oxide dissolving agent. This can be interpreted as follows: when grains of a metal oxide polished out with a solid abrasive are dissolved into the polishing slurry, the polishing-out effect of the solid abrasive increases.

However, a problem arises, which is dissolution of the metal film surface (referred to as etching hereinafter). When the oxidized layer on the metal film surface at concave portions is also etched to make the metal film surface exposed, the metal film surface is further oxidized with the oxidizer. When this is repeated, the etching of the metal film at the concave portions advances. Consequently, it is feared that flattening effect is damaged. For example, it is feared that the surface central portion of metal wiring buried therein is isotropically corroded so that the portion hollows into a dish form (dishing). Moreover, corrosion of the metal surface may be generated by the etching.

In order to prevent this, a metal inhibitor is added. Suggested is a method of using a polishing slurry for metal which contains BTA (benzotriazole) and a metal oxide dissolving agent made of an aminoacetic acid, such as glycine, or an amidosulfuric acid in order to restrain dishing, or corrosion of copper alloy during polishing and thereby to form LSI wiring having a high reliability. This technique is disclosed in, for example, Japanese Patent Application Laid-Open No. 8-83780.

However, the addition of the metal inhibitor may cause a decline in the polishing speed. To maintain the flattening property, it is important to balance the effect of the metal oxide dissolving agent with that of the metal inhibitor. It is desired that polished-out grains of the oxidized layer are effectively dissolved to make the polishing speed due to the CMP large and further the oxidized layer on the metal film surface at concave portions is not etched largely.

When a metal oxide dissolving agent and a metal inhibitor are added as described above to annex chemical reaction effect, the polishing speed based on CMP is improved and further an effect that damage of the metal layer surface subjected to the CMP decreases is obtained.

Meanwhile, a conductor film made of tungsten, tungsten nitride, a tungsten alloy, a different tungsten compound, or the like is formed, as a barrier layer, beneath copper or a copper alloy of wiring in order to prevent copper from diffusing into an interlayer insulating film therebelow. It is therefore necessary to use CMP to remove the barrier layer exposed in any other portion than the wiring portion in which the copper or the copper alloy is buried. However, the conductor film for the barrier layer has a higher hardness than the copper or the copper alloy; therefore, according to any combination of polishing materials for the copper or the copper alloy, a sufficient CMP speed cannot be obtained. Accordingly, the following problem is caused: while the barrier layer is removed by CMP, the copper, the copper alloy or the like is etched; consequently, the wiring thickness lowers.

The present invention provides a polishing slurry for metal which makes its polishing speed sufficiently high while its etching speed is kept low, restrains corrosion and dishing of a metal surface, and makes it possible to form a metal-film-buried pattern having a high reliability.

The present invention also provides a metal polishing method which makes its polishing speed sufficiently high while its etching speed is kept low, restrains corrosion and dishing of a metal surface, and makes it possible to form a metal-film-buried pattern having a high reliability with a good productivity, workability and yield.

DISCLOSURE OF THE INVENTION

The polishing slurry of the present invention relates to a polishing slurry for metal and a polishing method according to the following (1) to (18):

(1) A polishing slurry for metal, comprising an oxidizer, a metal oxide dissolving agent, a metal inhibitor, and water, wherein the metal inhibitor comprises:
  a compound having an amino-triazole skeleton wherein an amino group is bonded to carbon in a triazole ring; and
  a compound having an imidazole skeleton and represented by the following general formula (I):

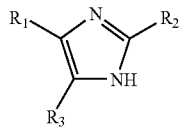

wherein $R_1$, $R_2$ and $R_3$ each independently represent a hydrogen atom, an amino group, or a $C_1$-$C_{12}$ alkyl chain provided that the case that all of $R_1$, $R_2$ and $R_3$ are hydrogen atoms is excluded.

(2) A polishing slurry for metal, comprising an oxidizer, a metal oxide dissolving agent, a metal inhibitor, and water, wherein the metal inhibitor comprises:
  a compound having a triazole skeleton having no amino group; and
  a compound having an imidazole skeleton and represented by the following general formula (I):

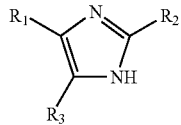

wherein $R_1$, $R_2$ and $R_3$ each independently represent a hydrogen atom, an amino group, or a $C_1$-$C_{12}$ alkyl chain provided that the case that all of $R_1$, $R_2$ and $R_3$ are hydrogen atoms is excluded.

(3) A polishing slurry for metal, comprising an oxidizer, a metal oxide dissolving agent, a metal inhibitor, and water, wherein the metal inhibitor comprises:
  a compound having an amino-triazole skeleton wherein an amino group is bonded to carbon in a triazole ring; and
  a compound having a triazole skeleton having no amino group.

(4) The polishing slurry according to the above-mentioned (1) or (3), wherein the compound having the amino-triazole skeleton is 3-amino-1,2,4-triazole.

(5) The polishing slurry according to the above-mentioned (1) or (2), wherein the compound having the imidazole skeleton is at least one selected from the group consisting of 2-methylimidazole, 2-ethylimidazole, 2-(isopropyl)imidazole, 2-propylimidazole, 2-butylimidazole, 4-methylimidazole, 2,4-dimethylimidazole, and 2-ethyl-4-methylimidazole.

(6) The polishing slurry according to the above-mentioned (2) or (3), wherein the compound having the triazole skeleton having no amino group is at least one selected from the group consisting of 1,2,3-triazole, 1,2,4-triazole, benzotriazole, and 1-hydroxybenzotriazole.

(7) The polishing slurry according to any one of the above-mentioned (1) to (6), wherein the metal inhibitor comprises the compound having the amino-triazole skeleton, the compound having the triazole skeleton having no amino group, and the compound having the imidazole skeleton.

(8) The polishing slurry for metal according to any one of the above-mentioned (1) to (7), further comprising a water-soluble polymer.

(9) The polishing slurry for metal according to the above-mentioned (8), wherein the water-soluble polymer is at least one selected from polysaccharides, polycarboxylic acids, polycarboxylic acid esters, polycarboxylic acid salts, polyacrylamide, and vinyl polymers.

(10) The polishing slurry for metal according to any one of the above-mentioned (1) to (9), wherein the oxidizer for metal is at least one selected from the group consisting of hydrogen peroxide, nitric acid, potassium periodate, hypochlorous acid, persulfates, and ozone water.

(11) The polishing slurry for metal according to any one of the above-mentioned (1) to (10), wherein the metal oxide dissolving agent is at least one selected from the group consisting of organic acids, organic acid esters, ammonium salts of organic acids, and sulfuric acid.

(12) The polishing slurry for metal according to any one of the above-mentioned (1) to (11), further comprising an abrasive.

(13) The polishing slurry for metal according to any one of the above-mentioned (1) to (12), wherein a metal film to be polished is at least one selected from the group consisting of copper, copper alloys, copper oxides, oxides of copper alloys, tantalum and compounds thereof, titanium and compounds thereof, and tungsten and compounds thereof.

(14) A method for polishing a metal film by supplying the polishing slurry for metal according to any one of the above-mentioned (1) to (13) onto a polishing cloth of a polishing table while moving the polishing table and a substrate having the metal film relatively in the state that the substrate is pressed against the polishing cloth.

(15) The polishing method according to the above-mentioned (14), wherein the metal film is at least one selected from the group consisting of copper, copper alloys, copper oxides, oxides of copper alloys, tantalum and compounds thereof, titanium and compounds thereof, and tungsten and compounds thereof.

(16) The polishing method according to the above-mentioned (14) or (15), wherein a laminate of two or more metal films is continuously polished.

(17) The polishing method according to the above-mentioned (16), wherein a first film which is first polished among the two or more metal laminated films is one or more selected from copper, copper alloys, copper oxides, and oxides of copper alloys, and a second film which is next polished among them is one or more selected from tantalum and compounds thereof, titanium and compounds thereof, and tungsten and compounds thereof.

(18) A polishing method, comprising a first polishing step of polishing a wiring metal layer of a substrate, the substrate comprising an interlayer insulating film which has a surface consisting of concave portions and convex portions, a barrier layer which covers the interlayer insulating film along the surface thereof, and a wiring metal layer which fills the concave portions to cover the barrier layer, and thereby making the barrier layer at the convex portions exposed, and a second polishing step of polishing at least the barrier layer and the wiring metal layer at the concave portions after the first polishing step, thereby making the interlayer insulating layer at the convex portions exposed, wherein the polishing is performed by use of the polishing slurry for metal according to any one of the above-mentioned (1) to (13) at least in the second polishing step.

BEST MODES FOR CARRYING OUT THE INVENTION

The present invention will be described in detail hereinafter.

The polishing slurry for metal of the invention comprises, as main constituent components, an oxidizer, a metal oxide dissolving agent, a metal inhibitor, and water. The metal inhibitor comprises a compound (A) having an amino-triazole skeleton wherein an amino group is bonded to carbon in a triazole ring and a compound (B) having an imidazole skeleton and represented by the following general formula (I):

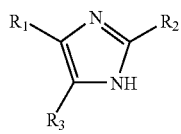

wherein $R_1$, $R_2$ and $R_3$ each independently represent a hydrogen atom, an amino group, or a $C_1$-$C_{12}$ alkyl chain provided that the case that all of $R_1$, $R_2$ and $R_3$ are hydrogen atoms is excluded; or
comprises the compound (B) and a compound (C) having a triazole skeleton having no amino group; or
comprises the compound (A) and the compound (C).
2-aminoimidazole. These may be used alone or in combination of two or more thereof. It is particularly preferred to select one or more compounds from 2-methylimidazole, 2-ethylimidazole, 2-(isopropyl)imidazole, 2-propylimidazole, 2-butylimidazole, 4-methylimidazole, 2,4-dimethylimidazole, and 2-ethyl-4-methylimidazole.

In the invention, the compound having an amino-triazole skeleton is preferably a compound wherein an amino group is bonded to a carbon atom in a triazole skeleton. 3-Amino-1,2,4-triazole is more preferred, considering that the compound is industrially produced.

The polishing slurry for metal of the invention can further contain, as a metal inhibitor, a compound having a triazole skeleton having no amino group.

Examples of the compound having a triazole skeleton having no amino group include 1,2,3-triazole, 1,2,4-triazole, benzotriazole, 1-hydroxybenzotriazole, 1-dihydroxypropyl-benzotriazole, 2,3-dicarboxypropylbenzotriazole, 4-hydroxybenzotriazole, 4-carboxy(-1H-)benzotriazole, 4-carboxy(-1H-)benzotriazole methyl ester, 4-carboxy(-1H-)benzotriazole butyl ester, 4-carboxy(-1H-)benzotriazole octyl ester, 5-hexylbenzotriazole, [1,2,3-benzotriazolyl-1-methyl][1,2,4-triazolyl-1-methyl][2-ethylhexyl]amine, tolyltriazole, naphthotriazole, and bis[(1-benzotriazolyl)methyl]phosphonic acid. These metal inhibitors may be used alone or in combination of two or more thereof.

It is more preferred to use, as the metal inhibitors, at least one of the compound having an amino-triazole skeleton and the compound having a triazole skeleton having no amino group, together with the compound having an imidazole skeleton. It is also more preferred to use the compound having an amino-triazole skeleton together with the compound having a triazole skeleton having no amino group.

In the invention, the total blend amount of the metal inhibitor(s) is preferably from 0.001 to 10% by weight, more preferably from 0.01 to 8% by weight, and in particular preferably from 0.02 to 5% by weight of the total of the polishing slurry for metal. If this blend amount is less than 0.001% by weight, the etching tends not to be easily restrained or a sufficient improvement in the polishing speed tends not to be obtained. If the amount is more than 10% by weight, the polishing speed tends to be saturated or decreased. In the case of using, as the metal inhibitor, only the compound having an amino-triazole skeleton, it is particularly preferred to set the amount in the range of 0.05 to 5% by weight.

Examples of the oxidizer in the invention include hydrogen peroxide ($H_2O_2$), nitric acid, potassium periodate, hypochlorous acid, persulfates, and ozone water. Of these, hydrogen peroxide is particularly preferred. These may be used alone or in combination of two or more thereof.

When a substrate which is an object to be polished is a silicon substrate including elements for integrated circuits, it is undesired to pollute the substrate with an alkali metal, an alkaline earth metal, a halogenated compound, or the like. Thus, the oxidizer is desirably an oxidizer which does not contain any nonvolatile matter. However, ozone water is remarkably varied in its composition by the passage of time; accordingly, hydrogen peroxide is suitable. When the substrate is a glass substrate or the like containing no semiconductor element, the oxidizer may be an oxidizer which contains a nonvolatile matter.

The blend amount of the oxidizer is preferably from 0.1 to 50% by weight, more preferably from 0.2 to 25% by weight, and in particular preferably from 0.3 to 15% by weight of the total of the polishing slurry for metal. If the blend amount is less than 0.1% by weight, the metal is insufficiently oxidized so that the CMP speed tends to fall. If the amount is more than 50% by weight, corrosion tends to be generated in the polished face.

The metal oxide dissolving agent in the invention is not particularly limited if the agent is water-soluble. Examples thereof. Include organic acids such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glycerin acid, oxalic acid, maleic acid, succinic acid, glutaric acid, adipic acid, pimelic acid, maleic acid, phthalic acid, malic acid, tartaric acid, and citric acid; esters of these organic acids; and ammonium salts of these organic acids. Other examples thereof include inorganic acids such as hydrochloric acid, sulfuric acid, and nitric acid; ammonium salts of these inorganic acids, such as ammonium persulfate, ammonium nitrate, and ammonium chloride; and chromic acid. Among these, formic acid, maleic acid, malic acid, tartaric acid, and citric acid are particularly preferred for the CMP of a metal layer since the metal layer can be effectively polished. These may be used alone or in combination of two or more thereof.

The blend amount of the metal oxide dissolving agent is preferably from 0.001 to 10% by weight, more preferably from 0.01 to 8% by weight, and in particular preferably from 0.02 to 5% by weight of the total of the polishing slurry for metal. If this blend amount is less than 0.001% by weight, the polishing speed tends to decrease extremely. If the amount is more than 10% by weight, the etching tends not to be easily restrained.

The polishing slurry for metal of the invention can further contain a water-soluble polymer. Examples of the water-soluble polymer include polysaccharides such as alginic acid, pectic acid, carboxymethylcellulose, agar, curdlan, and pullulan; polycarboxylic acids such as polyasparagic acid, polyglutamic acid, polylysine, polymalic acid, polymethacrylic acid, polyamide acid, polymaleic acid, polyitaconic acid, polyfumaric acid, poly(p-styrenecarboxylic acid), polyacrylic acid, and polyglyoxylic acid; and salts, esters and derivatives of polycarboxylic acids such as ammonium polymethacrylate, sodium polymethacrylate, polyacrylamide, polyaminoacrylamide, ammonium polyacrylate, sodium polyacrylate, an ammonium salt of polyamide acid, and a sodium salt of polyamide acid; and vinyl polymers such as polyvinyl alcohol, polyvinylpyrrolidone, and polyacrolein. Other examples include esters thereof and ammonium salts thereof.

Among these, preferred is at least one selected from the group consisting of polysaccharides, polycarboxylic acids, polycarboxylic acid esters, polycarboxylic acid salts, polyacrylamide, and vinyl polymers. Specifically, preferred are pectic acid, agar, polymalic acid, polymethacrylic acid, polyacrylic acid, polyacrylamide, polyvinyl alcohol, polyvinylpyrrolidone, and esters and ammonium salts thereof. In the case that a substrate to be used is a silicon substrate for semiconductor integrated circuits, or the like, the acids or ammonium salts thereof are desired since it is undesired to pollute the substrate with an alkali metal, an alkaline earth metal, a halogenated compound or the like. This is not applied to the case that the substrate is a glass substrate or the like.

The blend amount of the water-soluble polymer is preferably from 0 to 10% by weight, more preferably from 0.01 to 8% by weight, and in particular preferably from 0.02 to 5% by weight of the total of the polishing slurry. If this blend amount is more than 10% by weight, the polishing speed tends to lower.

The weight-average molecular weight (in terms of standard polystyrene, measured by GPC) of the water-soluble polymer is preferably 500 or more, more preferably 1,500 or more, and in particular preferably 5,000 or more. The upper limit of the weight-average molecular weight is not particularly limited, and is preferably 5,000,000 or less from the viewpoint of the solubility. If the weight-average molecular weight is less than 500, a high polishing speed tends not to be expressed. In the invention, it is preferred to use at least one water-soluble polymer having a weight-average molecular weight of 500 or more.

The polishing slurry of the invention may contain an abrasive. A silicon dioxide film is used as an insulating film for copper or copper alloy wiring of an LSI or the like. In the case that at this time tantalum or the like, which constitutes a barrier layer, is polished and subsequently the silicon dioxide film is polished with the polishing slurry of the invention, the polishing slurry preferably contains an abrasive.

The abrasive in the invention may be an inorganic abrasive made of silica, alumina, zirconia, ceria, titania, germania, silicon carbide or the like, or an organic abrasive made of polystyrene, polyacryl, polyvinyl chloride or the like, and is preferably made of at least one selected from silica, alumina, ceria, titania, zirconia, and germania. Furthermore, preferred is colloidal silica or colloidal alumina having an average particle diameter of 150 nm or less which provide good dispersion stability in the polishing slurry and generate less scratches by CMP. The average particle diameter is more preferably 100 nm or less, which makes the speed of polishing the barrier layer larger, even more preferably 70 nm or less. There is known a production process for colloidal silica by means of the hydrolysis of silicon alkoxide or the ion exchange of sodium silicate. There is known a production process for colloidal alumina by means of the hydrolysis of aluminum nitrate.

In the case that the abrasive is incorporated, the concentration of the abrasive is preferably from 0.01 to 20.0% by weight, more preferably from 0.05 to 15.0% by weight, and most preferably from 0.1 to 8.0% by weight of the total of the polishing slurry. If the abrasive concentration is less than 0.01% by weight, the effect based on the addition of the abrasive is not recognized. If the abrasive is added into a concentration of more than 20.0% by weight, the abrasive grains aggregate easily and further the polishing speed does not conspicuously become higher.

If necessary, it is allowable to incorporate, into the polishing slurry for metal of the invention, a dispersing agent, for example, a surfactant, or a coloring matter, for example, a dye such as Victoria pure blue, or a pigment such as phthalocyanine green at a concentration of about 0.01 to 1% by weight, more preferably at a concentration of about 0.1 to 0.8% by weight. About the blend amount of the water, the water may constitute the balance. If the water is contained in the polishing slurry, no restriction is not imposed.

Examples of a metal film to which the present invention is to be applied, as a film to be polished, include copper, copper alloys, copper oxides, and oxides of copper alloys (referred to as copper and compounds thereof hereinafter); tantalum, tantalum nitride, tantalum alloys, and the like (referred to as tantalum and compounds thereof hereinafter); titanium, titanium nitride, titanium alloys, and the like (referred to as titanium and compounds thereof hereinafter); and tungsten, tungsten nitride, tungsten alloys, and the like (referred to as tungsten and compounds thereof hereinafter). These can be made into a film by known sputtering or plating. Furthermore, the metal film may be a laminated film wherein two or more out of the above-mentioned metals are combined.

The laminated film is, for example, a laminated film having: an upper layer (a first layer which is first polished) selected from copper and compounds thereof; and a lower layer (a second film which is subsequently polished) selected from tantalum and compounds thereof, titanium and compounds thereof, and tungsten and compounds thereof.

The use of the polishing slurry for metal of the invention makes it possible to polish a laminated film of metal films made of two or more out of the above-mentioned metals. In other words, it is possible to save a labor for exchanging polishing slurries for the respective metal films.

A first polishing method of the present invention is a polishing method for polishing a metal film, which is a film to be polished, by supplying the above-mentioned polishing slurry for metal onto a polishing cloth of a polishing table while moving the polishing table and a substrate having the metal film to be polished relatively in the state that the substrate is pressed against the polishing cloth. A polishing device that can be used may be an ordinary polishing device having a holder for holding a substrate having a metal layer, and a polishing table onto which a polishing cloth (polishing pad) can be stuck and to which a motor or the like that can give a variable rotation number are fitted.

The polishing cloth is not particularly limited, and ordinary nonwoven cloth, foamed polyurethane, porous fluorine-contained resin or the like can be used. Conditions for the polishing are not limited. The rotating speed of the polishing table is preferably as low as 200 rpm or less so as not to cause the substrate to fly out. The pressing pressure (polishing pressure) of the substrate having the film to be polished against the polishing cloth is preferably from 1 to 100 kPa. The pressure is more preferably from 5 to 50 kPa in order to cause evenness of the CMP speed in a wafer face and the smoothness of a pattern to be satisfied.

The polishing manner can be arbitrarily selected in accordance with the film to be polished or the polishing device as long as the manner causes the polishing table and the substrate to be relatively moved. Examples thereof include a polishing manner of rotating or swinging the holder, a polishing manner of rotating the polishing table in a planetary form, and a polishing manner of moving the polishing cloth in a belt form linearly along one longitudinal direction thereof, besides a manner of rotating the polishing table. The holder may be in any one of fixation, rotation and swing states.

While the substrate is polished, the polishing slurry for metal is continuously supplied between the polishing cloth surface and a surface to be polished of the substrate. The supplied amount thereof is not limited. Preferably, the surface of the polishing cloth should be covered with the polishing slurry at any time.

Preferably, the substrate after the polishing is sufficiently washed with flowing water, water drops on the substrate are swept off by use of a spin drier or the like, and then the substrate is dried.

The polishing slurry for metal of the invention and the polishing method using this polishing slurry give a sufficiently high metal-polishing speed and a small etching speed; therefore, they exhibit high productivity and give a little corrosion and a little dishing of the surface of the metal. Accordingly, they are very excellent for an improvement in minuteness, a decrease in film-thickness, in dimensional precision, and in electrical characteristics. Thus, they are suitable for the production of semiconductor devices and instruments having high reliability.

A second polishing method of the present invention is a polishing method comprising a first polishing step of preparing a substrate comprising an interlayer insulating film which has a surface consisting of concave portions and convex portions, a barrier layer which covers the interlayer insulating film along the surface thereof, and a wiring metal layer which fills the concave portions to cover the barrier layer and polishing the wiring metal layer of the substrate, thereby making the barrier layer at the convex portions exposed, and a second polishing step of polishing at least the barrier layer and the wiring metal layer at the concave portions after the first polishing step, thereby making the interlayer insulating layer at the convex portions exposed, wherein the polishing is performed by use of the polishing slurry for metal of the present invention at least in the second polishing step.

The interlayer insulating film may be a silicon based coating film or an organic polymer film. The silicon based coating film may be a silica based coating film made of silicon dioxide, fluorosilicate glass, organosilicate glass which is obtained from a starting material such as trimethylsilane and dimethoxydimethylsilane, silicon oxynitride, hydrogenated silsesquioxane or the like; silicon carbide; or silicon nitride. The organic polymer film may be an entirely-aromatic, low-dielectric-constant interlayer insulating film. Organosilicate glass is particularly preferred. These films are formed by CVD, spin coating, dip coating, spraying or the like.

The barrier layer is formed to prevent a metal such as copper from diffusing into the interlayer insulating film and improve the adhesiveness between the insulating film and the metal. The barrier layer is preferably made of at least one selected from tungsten and tungsten compounds, tantalum and tantalum compounds, and titanium and titanium compounds. The barrier layer may have a mono-layered structure made of one component, or a laminated structure made of two or more components.

The wiring metal layer may be a layer made mainly of metal such as copper and compounds thereof, tungsten, tungsten alloys, silver, gold, and other metals. It is preferred to polish a layer containing at least one selected from copper and compounds thereof among these components. The wiring metal layer can be formed on the barrier layer by known sputtering or plating.

The following will describe an embodiment of the polishing method of the invention along the formation of a wiring layer in a semiconductor device producing process.

First, an interlayer insulating film of silicon dioxide or the like is laminated onto a substrate of silicon. Next, concave portions (substrate-exposed portions) of a given pattern are formed in the surface of the interlayer insulating film by a known manner, such as the formation of a resist layer and etching, so as to form an interlayer insulating film consisting of the concave portions and convex portions. A barrier layer of tungsten or the like, for covering the interlayer insulating film along irregularities in the surface, is formed onto the interlayer insulating film by vapor deposition, CVD or the like. Furthermore, a wiring metal layer of copper or the like, for covering the barrier layer, is formed by vapor deposition, plating, CVD or the like, so as to fill the concave portions.

(First Polishing Step)

Next, this semiconductor substrate is fixed to a polishing device. The outermost wiring metal layer, as a face to be polished, is polished while a polishing slurry is supplied thereto. In this way, the barrier layer at the convex portions of the interlayer insulating film is exposed to the surface of the substrate, thereby yielding a desired conductor pattern wherein the metal layer remains in the concave portions of the interlayer insulating film.

(Second Polishing Step)

Next, the conductor pattern is rendered a face to be polished, and at least the exposed barrier layer and the wiring metal layer at the concave portions are polished while a polishing slurry of the present invention is supplied thereto. The polishing is finished at the time when the whole of the interlayer insulating film at the convex portions beneath the barrier layer is made exposed; and the metal layer, which becomes a wiring layer, remains in the concave portions so as to yield a desired pattern wherein cross sections of the barrier layer are exposed to boundaries between the convex portions and concave portions. In order to ensure better smoothness at the time of the end of the polishing, it is allowable to perform over-polishing (for example, in the case that the time to obtain the desired pattern in the second polishing step is 100 seconds, additionally polishing for 50 seconds besides the 100-second polishing is referred to as over-polishing 50%) so as to polish the interlayer insulating film at the convex portions up to such a depth that a part of the interlayer insulating film at the convex portions is included.

In the second polishing step, examples of the polishing manner include not only a manner of moving a polishing cloth and the substrate relatively in the state that the substrate face to be polished is pressed against the polishing cloth, thereby polishing the face to be polished, as performed in the first polishing method of the invention, but also a manner of bringing a brush made of metal or resin into contact with the surface to be polished and a manner of blowing a polishing slurry thereon at a given pressure.

At least in the second polishing step out of the first and second polishing steps, a polishing slurry of the present invention is used to perform polishing. A polishing slurry of the invention may be continuously used in the first and second polishing steps to perform polishing. In this case, it is particularly unnecessary to conduct the step of washing the face to be polished, the step of drying the face, or any other step between the first and second polishing steps. The process may be stopped therebetween in order to exchange polishing tables and polishing cloths, or change the working load or the like. The polishing slurries of the invention used in the first and second polishing steps may have the same composition or different compositions. In the case that the polishing slurries have the same composition, the polishing can be continued from the first polishing step to the second polishing step without stopping the process. Thus, this case is excellent in productivity.

An interlayer insulating film, a barrier layer and a wiring metal layer are further formed onto the thus-formed metal wiring. This is polished to make the whole of the semiconductor substrate smooth, thereby forming a second metal wiring layer. This process is repeated given times, thereby producing a semiconductor device having desired number of wiring layers.

EXAMPLES

The present invention will be described by way of the following examples. The invention is not limited by these examples.

Examples 1 to 4, 6 to 11, Reference Examples 1 and 2 and Comparative Examples 1 and 2

Method for Producing Polishing Slurries for Metal

Polishing slurries for metal were each prepared by mixing: 0.15% by weight of malic acid: 0.15% by weight of a water-soluble polymer (an acrylic polymer, weight-average molecular weight: about 10000); 0.2% by weight of an aminotriazole compound shown in Table 1 or 2; 0.2% by weight of a benzotriazole shown in Table 1 or 2 and/or 0.05% by weight of an imidazole compound shown therein as one or more metal inhibitors other than the aminotriazole compound; 9% by weight of hydrogen peroxide; and water as the balance; the ratio of each of these being a ratio thereof to the total amount.

The resultant polishing slurries for metal were each used to perform etching and CMP polishing under conditions described below and then make evaluation. Table 1 shows each polishing speed in the CMP for a copper substrate and each etching speed thereto together, and Table 2 shows each polishing speed for a tungsten substrate and each etching speed thereto together.

(Polishing Conditions)

Copper substrate: a silicon substrate on which metal copper of 1500 nm thickness was deposited Tungsten substrate: a silicon substrate on which a tungsten compound of 600 nm thickness was deposited Polishing slurry supplying amount: 15 cc/minute Polishing pad: foamed polyurethane resin (model number: IC1000, manufactured by Rodel)

Polishing pressure: 29.4 kPa (300 gf/cm$^2$)

Relative speed between the substrate and the polishing table: 45 m/minute, and polishing table rotating speed: 75 rpm (Items for Evaluation)

Polishing speed: the difference between the film thicknesses of each of the films before and after the polishing was obtained by the conversion of the electric resistance values thereof.

Etching speed: each of the substrates was immersed into each of the polishing slurries for metal which were stirred (room temperature, 25° C., stirring: 600 rpm), and the difference between the film thicknesses of each of the metal layers before and after the immersing was obtained by the conversion of the electric resistance values thereof.

Examples 13 to 20, Reference Examples 3 to 6, and Comparative Example 3

Method for Producing Polishing Slurries for Metal

Polishing slurries for metal were each prepared by mixing: 0.15% by weight of malic acid; 0.15% by weight of a water-soluble polymer (an acrylic polymer, weight-average molecular weight: about 10000); 0.2% by weight of an imidazole compound shown in Table 3; 0.2% by weight of a benzotriazole or 3-amino-1,2,4-triazole shown in Table 3; 9% by weight of hydrogen peroxide; and water as the balance; the ratio of each of these being a ratio thereof to the total amount.

The resultant polishing slurries for metal were each used to perform etching and CMP polishing and then make evaluation in the same way as in Example 1. Table 3 shows each etching speed together.

TABLE 1

| | | | Copper (unit: nm/minute) | |
|---|---|---|---|---|
| | Amino-triazole | Metal inhibitor | Polishing speed | Etching speed |
| Example 1 | 3-amino-1,2,4-triazole | benzotriazole | 173.4 | 0.27 |
| Example 2 | 3-amino-1,2,4-triazole | 2-butyl imidazole benzotriazole | 221.9 | 0.46 |
| Example 3 | 3-amino-1,2,4-triazole | 2-ethyl-4-methylimidazole benzotriazole | 188.4 | 0.20 |
| Example 4 | 3-amino-1,2,4-triazole | 2,4-dimethyl imidazole benzotriazole | 133.0 | 0.19 |
| Reference Example 1 | 3-amino-1,2,4-triazole | None | 132.2 | 2.50 |
| Comparative Example 1 | None | None | 123.0 | 4.70 |

TABLE 2

| | | | Tungsten (unit: nm/minute) | |
|---|---|---|---|---|
| | Amino-triazole | Metal inhibitor | Polishing speed | Etching speed |
| Example 6 | 3-amino-1,2,4-triazole | 2-butyl imidazole | 120.2 | 0.33 |
| Example 7 | 3-amino-1,2,4-triazole | 2-butyl imidazole benzotriazole | 80.7 | 0.16 |
| Example 8 | 3-amino-1,2,4-triazole | 2-ethyl imidazole | 116.0 | 1.21 |
| Example 9 | 3-amino-1,2,4-triazole | 2-(isopropyl) imidazole benzotriazole | 163.0 | 1.24 |
| Example 10 | 3-amino-1,2,4-triazole | 2-propyl imidazole benzotriazole | 147.0 | 1.51 |
| Example 11 | 3-amino-1,2,4-triazole | 2,4-dimethyl imidazole benzotriazole | 81.0 | 0.37 |
| Reference Example 2 | 3-amino-1,2,4-triazole | None | 82.2 | 2.00 |
| Comparative Example 2 | None | None | 30.2 | 2.53 |

TABLE 3

|  | Metal inhibitor | Etching speed (nm/minute) | |
|---|---|---|---|
|  |  | Copper | Tungsten |
| Example 13 | 2-methyl imidazole benzotriazole | 0.30 | 1.00 |
| Example 14 | 2-ethyl imidazole benzotriazole | 0.03 | 1.21 |
| Example 15 | 2-(isopropyl) imidazole benzotriazole | 0.19 | 1.24 |
| Example 16 | 2-propyl imidazole benzotriazole | 0.13 | 1.51 |
| Example 17 | 2-butyl imidazole benzotriazole | 0.46 | 0.16 |
| Example 18 | 4-methyl imidazole benzotriazole | 0.09 | 0.15 |
| Example 19 | 2,4-dimethyl imidazole benzotriazole | 0.19 | 0.37 |
| Example 20 | 2-ethyl-4-methyl imidazole benzotriazole | 0.20 | 0.86 |
| Reference Example 3 | 2-butyl imidazole | 1.80 | 0.33 |
| Reference Example 4 | 4-methyl imidazole | 2.12 | 1.40 |
| Reference Example 5 | 2,4-dimethyl imidazole | 1.69 | 0.36 |
| Reference Example 6 | 3-amino-1,2,4-triazole | 2.50 | 2.00 |
| Comparative Example 3 | benzotriazole | 2.50 | 10.00 |

In each of Examples 1 to 4, Reference Example 1, the speed of polishing copper was 130 nm/minute or more, and was better than in Comparative Example 1. The etching speed was also a sufficiently lower than in the Comparative Example.

In each of Examples 6 to 11, Reference Example 2, the speed of polishing tungsten was 80 nm/minute or more, and was better than in Comparative Example 2. The etching speed was also a sufficiently lower than in the Comparative Example.

In each of Examples 13 to 20, the speed of etching copper was 0.5 nm/minute or less, and was much better than in Comparative Example 3. About tungsten also, the etching speed was a sufficiently lower than in the Comparative Example. In each of Reference Examples 3 to 6, the etching speed was sufficiently lower about tungsten, and was at a practical level.

In each of Examples 13 to 20, Reference Examples 3 to 6, the speed of polishing copper and that of polishing tungsten were 100 nm/minute or more and 20 nm/minute or more, respectively, and were at a sufficiently practical level.

Example 25

A polishing slurry for metal was prepared by mixing: 0.15% by weight of malic acid; 0.15% by weight of a water-soluble polymer (an acrylic polymer, weight-average molecular weight: about 10000); 0.3% by weight of 3-amino-1,2,4-triazole; 0.14% by weight of benzotriazole; 0.05% by weight of 2,4-dimethylimidazole; 0.4% by weight of an abrasive (colloidal silica, primary particle diameter: 30 nm); 9% by weight of hydrogen peroxide; and water as the balance.

Trenches of 0.5 to 100 μm depth were made in silicon dioxide, and a tungsten layer of 50 nm thickness was formed as a barrier layer by a known method. A copper film was formed thereon so as to have a thickness of 1.0 μm. A silicon substrate was thus prepared. The substrate was polished with the above-mentioned polishing slurry under the same conditions as in Example 1 until convex portions of the silicon dioxide were exposed in the entire surface of the substrate. The time for the polishing was 2 minutes, and a polishing speed of about 500 nm/minute or more was obtained. Next, a tracer type level meter was used to obtain the decreased amount of the film thickness of the wiring metal regions with respect to that of the insulating film regions, from the surface shape of a stripe-form pattern wherein wiring metal regions 100 μm in width and insulating film regions 100 μm in width were alternately arranged. As a result, the amount was 70 nm, and was a sufficiently practical value.

Next, a tracer type level meter was used to obtain the decreased amount of the film thickness of the wiring metal regions with respect to that of the insulating film regions, from the surface shape of a stripe-form pattern wherein wiring metal regions 100 μm in width and insulating film regions 100 μm in width were alternately arranged. As a result, the amount was 70 nm, and was a sufficiently practical value.

Example 26

A polishing slurry for metal was prepared by mixing: 0.15% by weight of malic acid; 0.15% by weight of a water-soluble polymer (an acrylic polymer, weight-average molecular weight: about 10000); 0.3% by weight of 3-amino-1,2,4-triazole; 0.14% by weight of benzotriazole; 0.05% by weight of 2,4-dimethylimidazole; 9% by weight of hydrogen peroxide; and water as the balance.

Etching was performed in the same way as in Example 1 except that this polishing slurry was used. At this time, the speed of etching copper was 0.37 nm/minute, and that of etching tungsten was 0.49 nm/minute.

The same silicone substrate as used in Example 25 was polished with the above-mentioned polishing slurry under the same conditions as in Example 1 until the convex portions of silicon dioxide were made exposed in the entire surface of the substrate. The time for the polishing was 3 minutes, and a polishing speed of about 350 nm/minute or more was obtained. Next, a tracer type level meter was used to obtain the decreased amount of the film thickness of the wiring metal regions with respect to that of the insulating film regions, from the surface shape of a stripe-form pattern wherein wiring metal regions 100 μm in width and insulating film regions 100 μm in width were alternately arranged. As a result, the amount was 50 nm, and was a sufficiently practical value.

INDUSTRIAL APPLICABILITY

The polishing slurry for metal of the present invention makes it possible to raise the polishing speed sufficiently while keeping the etching speed low, restrain the generation of corrosion and dishing of the surface of a metal, and form a metal-film-buried pattern having a high reliability.

The polishing method of the present invention makes it possible to raise the polishing speed sufficiently while keeping the etching speed low, restrain the generation of corrosion and dishing of the surface of a metal, and form a metal-film-buried pattern having a high reliability with a good productivity, workability and yield.

The invention claimed is:
1. A method for polishing a substrate having a first metal film and a second metal film,
by supplying a polishing slurry for metal onto a polishing cloth of a polishing table while moving the polishing table and the substrate relatively in the state that the substrate is pressed against the polishing cloth,
wherein the first metal film is one or more selected from copper, copper alloys, copper oxides, and oxides of copper alloys, and the second metal film is one or more selected from tantalum and compounds thereof, titanium and compounds thereof, and tungsten and compounds thereof, wherein the polishing slurry for metal comprises an oxidizer, a metal oxide dissolving agent, a metal inhibitor, and water, and wherein the metal inhibitor comprises:

a compound having an amino-triazole skeleton wherein an amino group is bonded to carbon in a triazole ring; and a compound having an imidazole skeleton and represented by the following general formula (I):

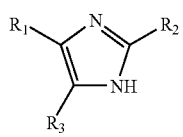

(I)

wherein $R_1$, $R_2$ and $R_3$ each independently represent a hydrogen atom, an amino group, or a $C_1$-$C_{12}$ alkyl chain and provided that the case that all of $R_1$, $R_2$ and $R_3$ are hydrogen atoms is excluded, and wherein the substrate undergoes a first polishing process and a second polishing process;

wherein the substrate is polished with a polishing slurry in the first polishing process; and then in the second polishing process the polishing slurry for metal polishes the first metal film and the second metal film so as to achieve a desired pattern.

2. A method for polishing a substrate having a first metal film and a second metal film, by supplying a polishing slurry for metal onto a polishing cloth of a polishing table while moving the polishing table and the substrate relatively in the state that the substrate is pressed against the polishing cloth, wherein the first metal film is one or more selected from copper, copper alloys, copper oxides, and oxides of copper alloys, and the second metal film is one or more selected from tantalum and compounds thereof, titanium and compounds thereof, and tungsten and compounds thereof, wherein the polishing slurry for metal comprises an oxidizer, a metal oxide dissolving agent, a metal inhibitor, and water, and wherein the metal inhibitor comprises:

a compound having a triazole skeleton having no amino group; and a compound having an imidazole skeleton and represented by the following general formula (I):

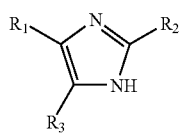

(I)

wherein $R_1$, $R_2$ and $R_3$ each independently represent a hydrogen atom, an amino group, or a $C_1$-$C_{12}$ alkyl chain and provided that the case that all of $R_1$, $R_2$ and $R_3$ are hydrogen atoms is excluded, and wherein the substrate undergoes a first polishing process and a second polishing process;

wherein the substrate is polished with a polishing slurry in the first polishing process; and then in the second polishing process the polishing slurry for metal polishes the first metal film and the second metal film so as to achieve a desired pattern.

3. A method for polishing a substrate having a first metal film and a second metal film, by supplying a polishing slurry for metal onto a polishing cloth of a polishing table while moving the polishing table and the substrate relatively in the state that the substrate is pressed against the polishing cloth, wherein the first metal film is one or more selected from copper, copper alloys, copper oxides, and oxides of copper alloys, and the second metal film is one or more selected from tantalum and compounds thereof, titanium and compounds thereof, and tungsten and compounds thereof, wherein the polishing slurry for metal comprises an oxidizer, a metal oxide dissolving agent, a metal inhibitor, and water, and wherein the metal inhibitor comprises:

a compound having an amino-triazole skeleton wherein an amino group is bonded to carbon in a triazole ring; and a compound having a triazole skeleton having no amino group, and wherein the substrate undergoes a first polishing process and a second polishing process;

wherein the substrate is polished with a polishing slurry in the first polishing process; and then in the second polishing process the polishing slurry for metal polishes the first metal film and the second metal film so as to achieve a desired pattern.

4. The method for polishing a substrate according to claim 1 or 3, wherein the compound having the amino-triazole skeleton is 3-amino-1,2,4-triazole.

5. The method for polishing a substrate according to claim 1 or 2, wherein the compound having the imidazole skeleton is at least one selected from the group consisting of 2-methylimidazole, 2-ethylimidazole, 2-(isopropyl)imidazole, 2-propylimidazole, 2-butylimidazole, 4-methylimidazole, 2,4-dimethylimidazole, and 2-ethyl-4-methylimidazole.

6. The method for polishing a substrate according to claim 2 or 3, wherein the compound having the triazole skeleton having no amino group is at least one selected from the group consisting of 1,2,3-triazole, 1,2,4-triazole, benzotriazole, and 1-hydroxybenzotriazole.

7. The method for polishing a substrate according to claim 1, wherein the metal inhibitor comprises the compound having the amino-triazole skeleton, a compound having a triazole skeleton having no amino group, and the compound having the imidazole skeleton.

8. The method for polishing a substrate for metal according to any one of claims 1 to 3, wherein the polishing slurry for metal further comprising a water-soluble polymer.

9. The method for polishing a substrate according to claim 8, wherein the water-soluble polymer is at least one selected from polysaccharides, polycarboxylic acids, polycarboxylic acid esters, polycarboxylic acid salts, polyacrylamide, and vinyl polymers.

10. The method for polishing a substrate according to any one of claims 1 to 3, wherein the oxidizer for metal is at least one selected from the group consisting of hydrogen peroxide, nitric acid, potassium periodate, hypochlorous acid, persulfates, and ozone water.

11. The method for polishing a substrate according to any one of claims 1 to 3, wherein the metal oxide dissolving agent is at least one selected from the group consisting of organic acids, organic acid esters, ammonium salts of organic acids, and sulfuric acid.

12. The method for polishing a substrate according to any one of claims 1 to 3, wherein the polishing slurry for metal further comprising an abrasive.

13. The method for polishing a substrate according to claim 1, wherein the second metal film is selected from tantalum and compounds thereof.

14. The method for polishing a substrate according to claim 2, wherein the second metal film is selected from tantalum and compounds thereof.

15. The method for polishing a substrate according to claim 3, wherein the second metal film is selected from tantalum and compounds thereof.

16. The method for polishing a substrate according to claim 1, wherein the first polishing process comprises polishing a wiring metal layer of the substrate, wherein the substrate comprises an interlayer insulating film which has a surface consisting of concave portions and convex portions, a barrier layer which covers the interlayer insulating film along the surface thereof, and a wiring metal layer which fills the concave portions to cover the barrier layer, and thereby making the barrier layer at the convex portions exposed, and the second polishing process comprises polishing at least the barrier layer and the wiring metal layer at the concave portions after the first polishing step, thereby making the interlayer insulating layer at the convex portions exposed.

17. The method for polishing a substrate according to claim 2, wherein the first polishing process comprises polishing a wiring metal layer of the substrate, wherein the substrate comprises an interlayer insulating film which has a surface consisting of concave portions and convex portions, a barrier layer which covers the interlayer insulating film along the surface thereof, and a wiring metal layer which fills the concave portions to cover the barrier layer, and thereby making the barrier layer at the convex portions exposed, and the second polishing process comprises polishing at least the barrier layer and the wiring metal layer at the concave portions after the first polishing step, thereby making the interlayer insulating layer at the convex portions exposed.

18. The method for polishing a substrate according to claim 3, wherein the first polishing process comprises polishing a wiring metal layer of the substrate, wherein the substrate comprises an interlayer insulating film which has a surface consisting of concave portions and convex portions, a barrier layer which covers the interlayer insulating film along the surface thereof, and a wiring metal layer which fills the concave portions to cover the barrier layer, and thereby making the barrier layer at the convex portions exposed, and the second polishing process comprises polishing at least the barrier layer and the wiring metal layer at the concave portions after the first polishing step, thereby making the interlayer insulating layer at the convex portions exposed.

* * * * *